US012278645B2

(12) United States Patent
Huang et al.

(10) Patent No.: US 12,278,645 B2
(45) Date of Patent: Apr. 15, 2025

(54) HIGH RESOLUTION VCO-BASED ADC

(71) Applicant: The Regents of the University of California, Oakland, CA (US)

(72) Inventors: Jiannan Huang, La Jolla, CA (US); Patrick P. Mercier, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 262 days.

(21) Appl. No.: 17/924,180

(22) PCT Filed: May 27, 2021

(86) PCT No.: PCT/US2021/034514
§ 371 (c)(1),
(2) Date: Nov. 9, 2022

(87) PCT Pub. No.: WO2021/243019
PCT Pub. Date: Dec. 2, 2021

(65) Prior Publication Data
US 2023/0179211 A1 Jun. 8, 2023

Related U.S. Application Data

(60) Provisional application No. 63/031,652, filed on May 29, 2020.

(51) Int. Cl.
*H03M 1/06* (2006.01)
*H03M 1/08* (2006.01)
*H03M 3/00* (2006.01)

(52) U.S. Cl.
CPC ........ *H03M 1/0604* (2013.01); *H03M 1/0836* (2013.01); *H03M 1/0854* (2013.01); *H03M 3/00* (2013.01)

(58) Field of Classification Search
CPC ............. H03M 1/0604; H03M 1/0854; H03M 1/0836; H03M 3/00
See application file for complete search history.

(56) References Cited

U.S. PATENT DOCUMENTS 8,134,393 B1    3/2012  Nagaraj et al.
9,246,500 B2 *  1/2016  Perrott .................... H03L 7/093
(Continued)

OTHER PUBLICATIONS

Chandrakumar, H., et al., "A 15.2-ENOB 5-KHz BW 4.5-μW Chopped CT -ADC for Artifact-Tolerant Neural Recording Front Ends", 2018, IEEE Journal of Solid-State Circuits, vol. 53, No. 12, pp. 3470-3483.

(Continued)

*Primary Examiner* — Joseph J Lauture
(74) *Attorney, Agent, or Firm* — Greer, Burns & Crain, Ltd.; Steven P. Fallon

(57) ABSTRACT

An analog to digital conversion (ADC) circuit includes a voltage-controlled oscillator (VCO)-based quantizer that receives a voltage input signal to be quantized and provides a digital output. A predictor samples the digital output, evaluates correlation between successive samples, and predicts a predicted input sample from the correlation to minimize voltage-to-frequency transfer of the VCO. A feedback loop L1 with a digital to analog converter (DAC) receives the predicted input sample, converts it and subtracts it from the voltage input signal. A feedback loop L2 adds the predicted sample to the digital output.

20 Claims, 20 Drawing Sheets

(56) References Cited

U.S. PATENT DOCUMENTS

| | | | |
|---|---|---|---|
| 9,684,325 B1* | 6/2017 | Rasmus | G05F 1/575 |
| 2007/0092018 A1 | 4/2007 | Fonseka et al. | |
| 2008/0258949 A1 | 10/2008 | Galton et al. | |
| 2010/0039182 A1 | 2/2010 | Galton et al. | |
| 2010/0166084 A1 | 7/2010 | Galton et al. | |
| 2012/0194369 A1 | 8/2012 | Galton et al. | |

OTHER PUBLICATIONS

Jiang, W., et al., "A ±50-mV Linear-Input-Range VCO-Based Neural-Recording Front-End With Digital Nonlinearity Correction", 2017, IEEE Journal of Solid-State Circuits, vol. 52, No. 1, pp. 173-184.

Yang, X., et al., "A 108dB DR Hybrid-CTDT Direct-Digitalization -M Front-End with 720mVpp Input Range and >300mV Offset Removal for Wearable Bio-Signal Recording", 2019, Symposium on VLSI Circuits Digest of Technical Papers.

Zhao, W., et al., "A 0.025-mm2 0.8-V 78.5-dB SNDR VCO-Based Sensor Readout Circuit in a Hybrid PLL-M Structure", 2020, IEEE Journal of Solid-State Circuits, vol. 55, No. 3, pp. 666-679.

International Search Report from the corresponding International Patent Application No. PCT/US2021/034514, dated Jul. 23, 2021.

* cited by examiner

HIGH RESOLUTION VCO-BASED ADC

PRIORITY CLAIM AND REFERENCE TO RELATED APPLICATION

The application claims priority under 35 U.S.C. § 119 and all applicable statutes and treaties from prior U.S. provisional application Ser. No. 62/976,834 which was filed Feb. 14, 2020.

FIELD

A field of the invention is analog to digital conversion. Example applications of the invention include portable electronic devices, such as wearable sensors, Internet of Things (IoT) equipment, and sensors for autonomous vehicles.

TABLE OF ACRONYMS

The following table defines acronyms/abbreviations used throughout the following description:
 ADC Analog to Digital Converter
 AFE Analog Front-End
 BW Bandwidth
 CMFB Common Mode Feedback
 CT Continuous Time
 DAC Digital to Analog Converter
 DEM Dynamic Element Matching
 DPCM Differential Pulse Code Modulation
 DR Dynamic Range
 DWA Data Weighted Averaging
 $\Delta\Sigma M$ Delta-Sigma Modulation/Modulator
 $E_T$ Truncation Error
 GCW Gain Control Word
 GEC Gain Error Correction
 LFSR Linear Feedback Shift Register
 LMS Least Mean Square
 MC Monte Carlo
 NTF Noise Transfer Function
 OSR Oversampling Ratio
 PVT Process-Voltage-Temperature
 SNDR Signal to Noise Distortion Ratio
 SFDR Signal to Frequency Distortion Ratio
 SQNR Signal to Quantization Noise Ratio
 STF Signal Transfer Function
 THD Total Harmonic Distortion
 V-F Voltage-Frequency
 VCO Voltage Controlled Oscillator
 V/I Voltage to Current
 XTAL Crystal

BACKGROUND

Pragmatic adoption of wearable sensors requires robust AFEs that operate over a large DR to capture small biopotentials while tolerating large artifacts from motion and electrode offsets. One way to overcome this challenge is to design a large DR AFE with high linearity that digitizes both the desired signal and artifacts without saturation. To save power and area, various high-DR AFEs have been proposed with an ADC-direct architecture which integrate the high-impedance AFE into the ADC itself. Many of these employed modified forms of CT $\Delta\Sigma M$ for high resolution and inherent anti-aliasing. However, voltage domain CT-$\Delta\Sigma M$ have difficulty with technology scaling. VCO-based AFEs are alternative an provide intrinsic $1^{st}$ order noise shaping and frequency domain operation. However, conventional VCO-based ADCs suffer from non-linear V-F conversion and do not nominally feature high input impedance.

State of the art converters include the following.
W. Jiang, V. Hokhikyan, H. Chandrakumar, V. Karkare and D. Marković, "A ±50-mV Linear-Input-Range VCO-Based Neural-Recording Front-End With Digital Nonlinearity Correction," in IEEE Journal of Solid-State Circuits, vol. 52, no. 1, pp. 173-184, January 2017
H. Chandrakumar and D. Marković, "A 15.2-ENOB 5-kHz BW 4.5 uW Chopped CTDS-ADC for Artifact-Tolerant Neural Recording Front Ends," in IEEE Journal of Solid-State Circuits, vol. 53, no. 12, pp. 3470-3483, December 2018.
X. Yang et al., "A 108 dB DR Hybrid-CTDT Direct-Digitalization $\Delta\Sigma$-$\Sigma M$ Front-End with 720 mVpp Input Range and >300 mV Offset Removal for Wearable Bio-Signal Recording," 2019 Symposium on VLSI Circuits, Kyoto, Japan, 2019.
W. Zhao et al., "A 0.025-mm2 0.8-V 78.5-dB SNDR VCO-Based Sensor Readout Circuit in a Hybrid PLL-DSM Structure," in IEEE Journal of Solid-State Circuits, vol. 55, no. 3, pp. 666-679, March 2020.

Differential pulse code modulation (DPCM) has been used in transmitters to provide an encoded DPCM signal that leverages redundancy to reduce the bit rate that needs to be transmitted.

SUMMARY OF THE INVENTION

A preferred embodiment provides an analog to digital conversion (ADC) circuit including a voltage-controlled oscillator (VCO)-based quantizer that receives a voltage input signal to be quantized and provides a digital output. A predictor samples the digital output, evaluates correlation between successive samples, and predicts a predicted input sample from the correlation, and subtracts the predicted input sample from the input to minimize distortion resulting from voltage-to-frequency transfer of the VCO. A feedback loop L1 with a digital to analog converter (DAC) receives the predicted input sample, converts it and subtracts it from the voltage input signal. A feedback loop L2 adds the predicted input sample to the digital output.

A method for analog to digital conversion includes converting a voltage input to a digital output with a voltage-controlled oscillator (VCO)-based quantizer. The next input sample is predicted from the digital output evaluating correlation between successive samples. The predicted input sample is fed back by subtracting an analog converted version of the predicted input sample from an input of the VCO-quantizer via a first feedback loop L1. The digital output is obtained by adding the predicted sample via a second feedback loop L2.

DETAILED DESCRIPTION OF THE PREFERRED EMBODIMENTS

Preferred embodiments provide a high-resolution VCO-based ADC for high dynamic range precision applications. The ADC includes a VCO-based quantizer and a predictor and DAC in the feedback path. Prediction is applied via feedback to change the input seen by the VCO. The predictor is designed to exploit the correlation between successive input samples so that the quantizer only need to process a small prediction error. The small prediction error refers to the voltage swing that the VCO sees. For example, without feedback, the VCO will see a $1V_{pp}$ input directly. But the feedback provided in a preferred embodiment will generate a predicted input that is, e.g. $0.99V_{pp}$, so that now the VCO only sees $0.01V_{pp}$, which is two orders of magnitude reduction in the voltage swing seen by the VCO. In other words, the VCO sees a voltage swing corresponding to the size of predicted difference between predicted and actual voltage input. The prediction substantially reduces the input swing that the VCO quantizer sees, which, in turn, minimizes the voltage-to-frequency transfer of the VCO, enabling high performance. An example VCO input swing reduction is given in FIG. 3, which shows that 40 dB of reduction is achieved in the signal band given 32 OSR. In addition, a hybrid dynamic element matching technique is preferred to further increase the linearity of the feedback DAC. Together, these techniques/architectures enable a state-of-the-art THD of −105 dB, which is the best among the literature for sensor readout applications.

Preferred embodiments of the invention will now be discussed with respect to experiments and drawings. Broader aspects of the invention will be understood by artisans in view of the general knowledge in the art and the description of the experiments that follows.

Figure 1:
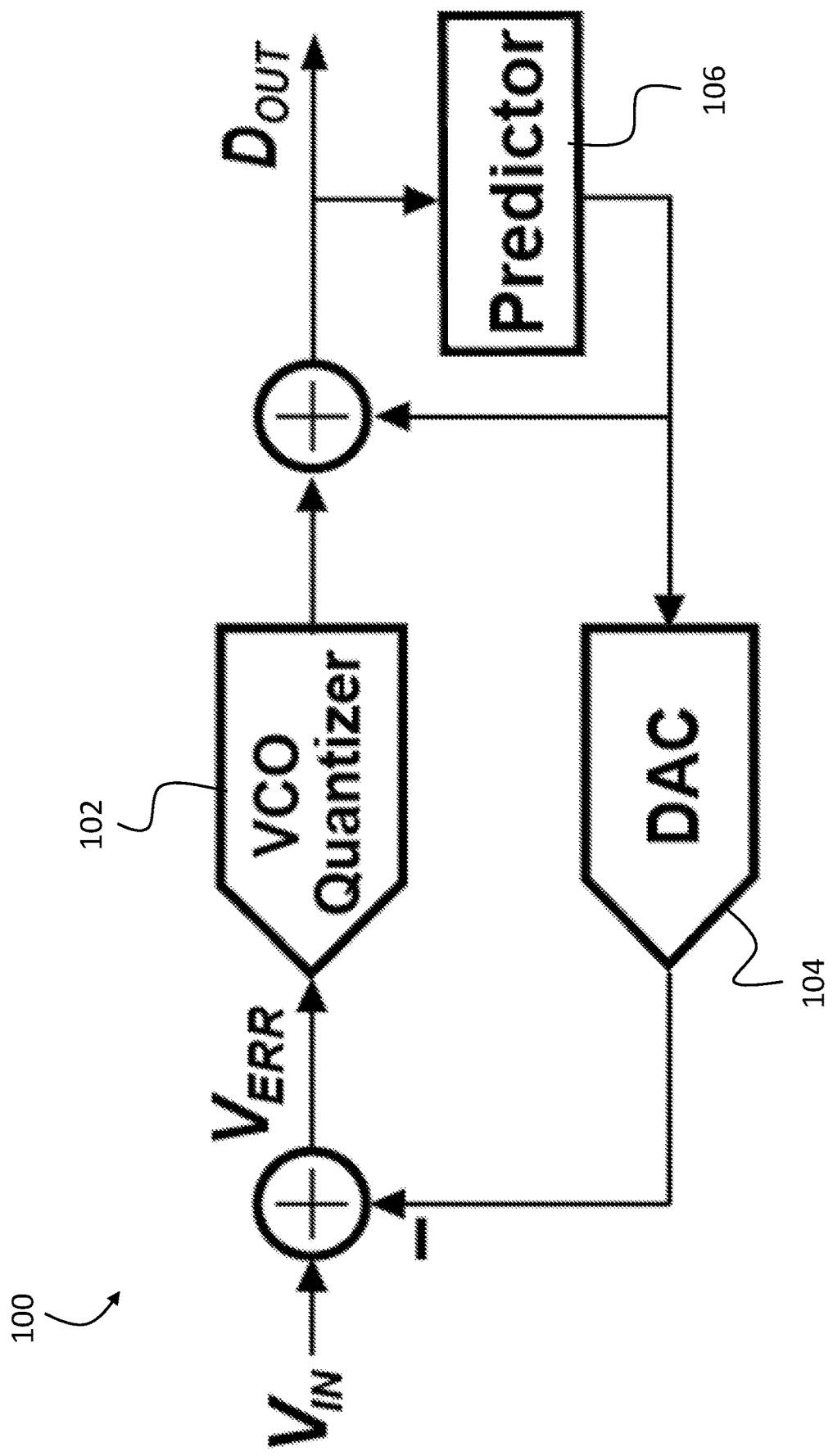
FIG. 1 is a block diagram of a preferred high-resolution VCO-based ADC of the invention.

A preferred ADC 100 is shown in FIG. 1. A VCO-based quantizer 102 quantizes and digitizes an input $V_{IN}$ to provide a digitized output $D_{OUT}$ with error correction provided in a feedback loop including a DAC 104 and a predictor 106. The ADC 100 provides a DPCM-like (with circuit blocks organized in a way that resembles the topology of DPCM) error reduction, which reduces a load on the VCO-based quantizer 102. The predictor 106 is designed to exploit the correlation between successive input samples so that the VCO-based quantizer 102 only need to process a small prediction error $V_{ERR}$. Basically, there is small difference between successive samples. This small difference is what is evaluated and exploited. Therefore, DPCM-like feedback substantially reduces the input swing that the VCO-based quantizer 102 sees, which, in turn, minimizes the voltage-to-frequency transfer of the VCO-based quantizer 102, enabling high performance.

Figure 2:
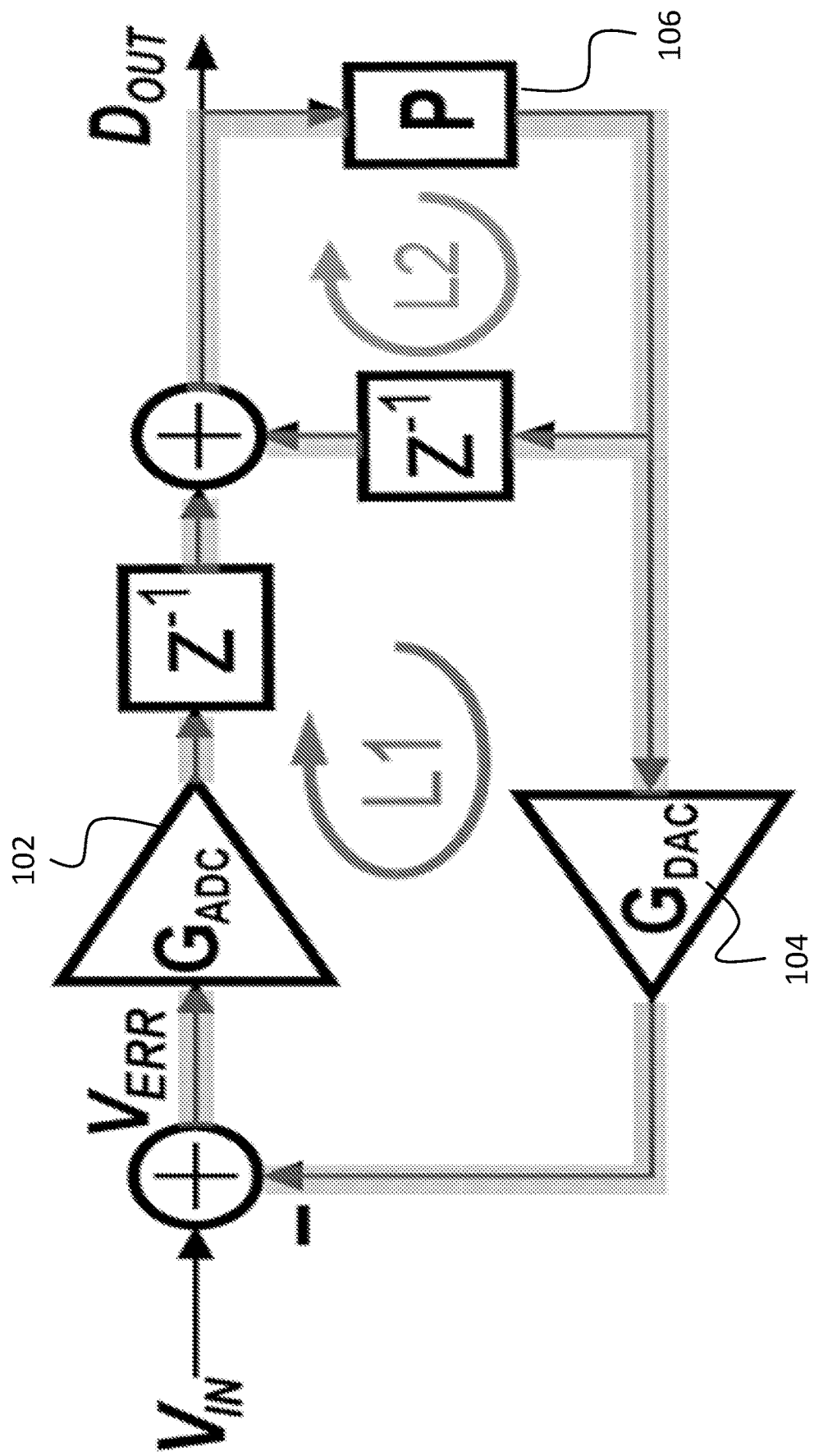
FIG. 2 is a discrete-time model of the FIG. 1 high-resolution VCO-based ADC.

FIG. 2 shows the discrete-time model where the VCO quantizer and DAC are replaced by gain blocks $G_{ADC}$ and $G_{DAC}$ to simplify analysis. There are two loops in the model. The loop gain magnitudes of the two loops are given by $$|L_1|=PG_{ADC}G_{DAC}z^{-1};$$

$$|L_2|=Pz^{-1};$$

Assuming the magnitudes are equal ($|L_1|=|L_2|$), this implies that $G_{ADC}G_{DAC}=1$. The transfer relation from $V_{IN}$ to $D_{OUT}$ is given by $$\frac{D_{OUT}}{V_{IN}} = \frac{G_{ADC}z^{-1}}{1+Pz^{-1}(G_{ADC}G_{DAC}-1)} = G_{ADC}z^{-1}.$$

Figure 3:
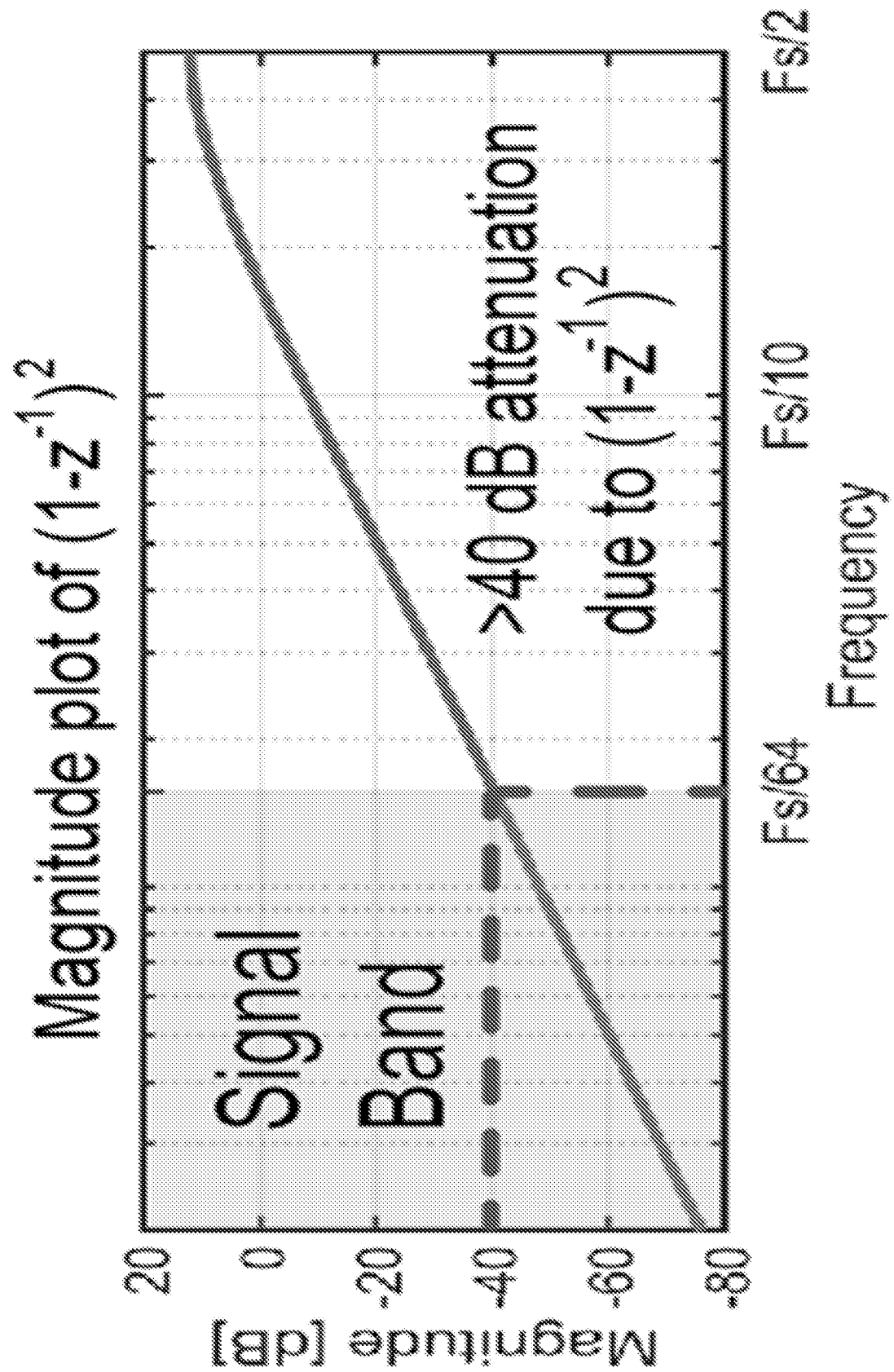
FIG. 3 is a magnitude v. frequency plot of attenuation for the preferred high-resolution VCO-based ADC at an over-sampling-ratio of 32.
Figure 4:
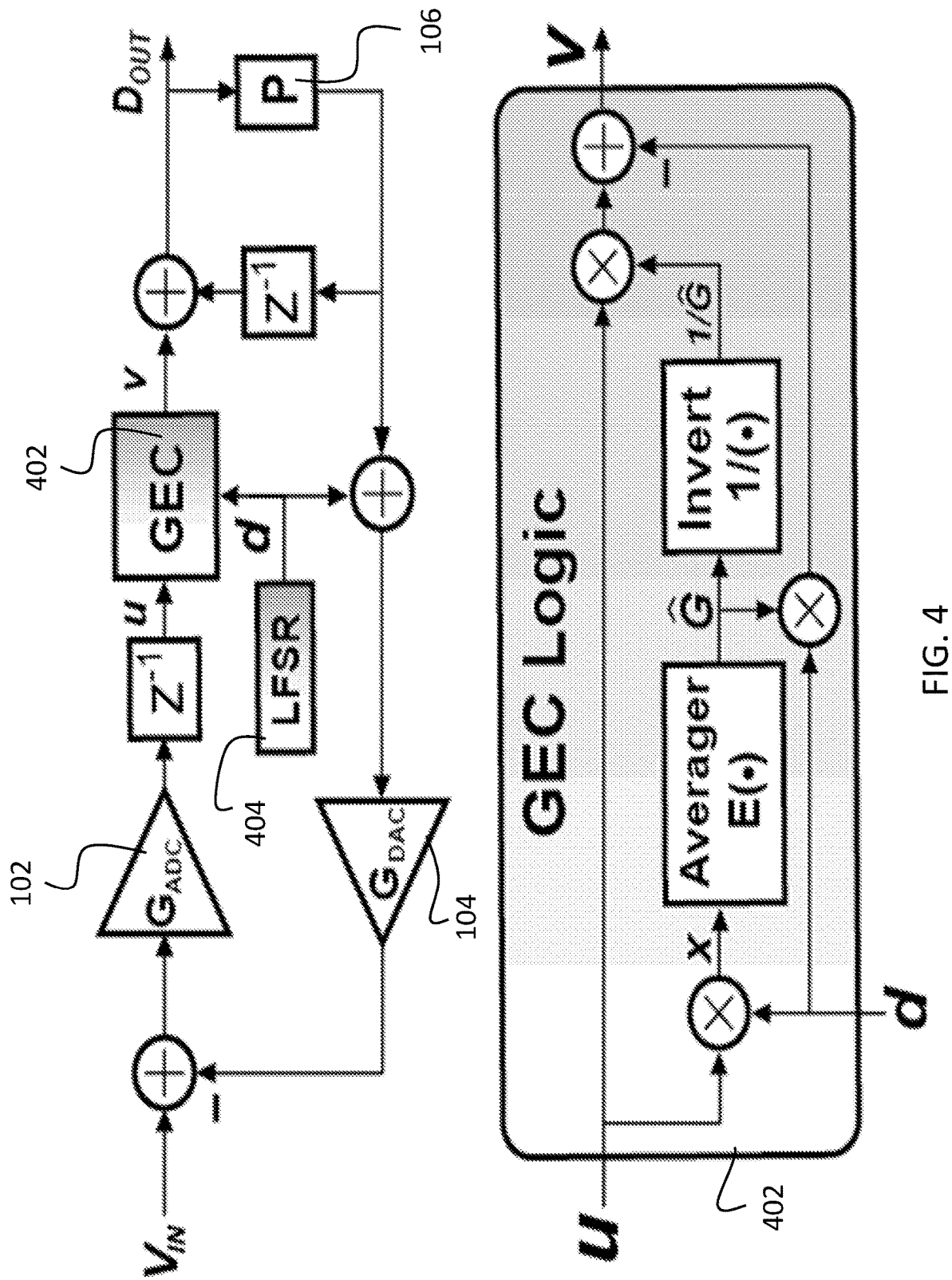
FIG. 4 is a block diagram of preferred GEC logic for the preferred high-resolution VCO-based ADC.

This shows that $D_{OUT}$ is simply scaled by $G_{ADC}$ which is the feedforward gain, as if no feedback exists. Also, since $G_{ADC}$ represents the VCO-based quantizer 102, it inherently has $1^{st}$ order quantization noise shaping. More importantly, if the predictor's transfer function is $P=2-z^{-1}$, the relation from $V_{IN}$ to $V_{ERR}$ is given by $$\frac{V_{ERR}}{V_{IN}} = \frac{1-G_{ADC}G_{DAC}Pz^{-1}}{1+Pz^{-1}(G_{ADC}G_{DAC}-1)} = 1-Pz^{-1} = (1-z^{-1})^2.$$

which provides ≥40 dB of attenuation of the input at an oversampling-ratio of 32 (FIG. 3—Magnitude plot of $(1−z^{-1})^2$ showing at least 40 dB attenuation of input swing), thereby greatly reducing the amplitude that the VCO sees and maximizing linearity through feedback.

In practice, $|L_1|\neq|L_2|$ due to PVT variations. This is solved by an all-digital GEC logic unit 402 to calibrate the loop gain in the background. To make $|L_1|=|L_2|$, we need to ensure $G_{ADC}G_{DAC}=1$. The GEC 402 uses a correlation-based calibration approach where a two-level (±1) zero mean random dither d from an LFSR 404 is injected to the DAC 104 and the GEC 402 logic. Inside the GEC logic 402, the dither d is multiplied with GEC input u which consists of the following $$u=G_{ADC}G_{DAC}d+C,$$

where c is the other components uncorrelated with d. The product x is then averaged to obtain $\hat{G}$, which can be shown to be the estimate of $G_{ADC}G_{DAC}$. Once $G_{ADC}G_{DAC}$ is estimated, the loop gain can be corrected by normalizing its value with the estimate. This is done by first inverting the estimate and then multiplying input u with the inverse.

Figure 5:
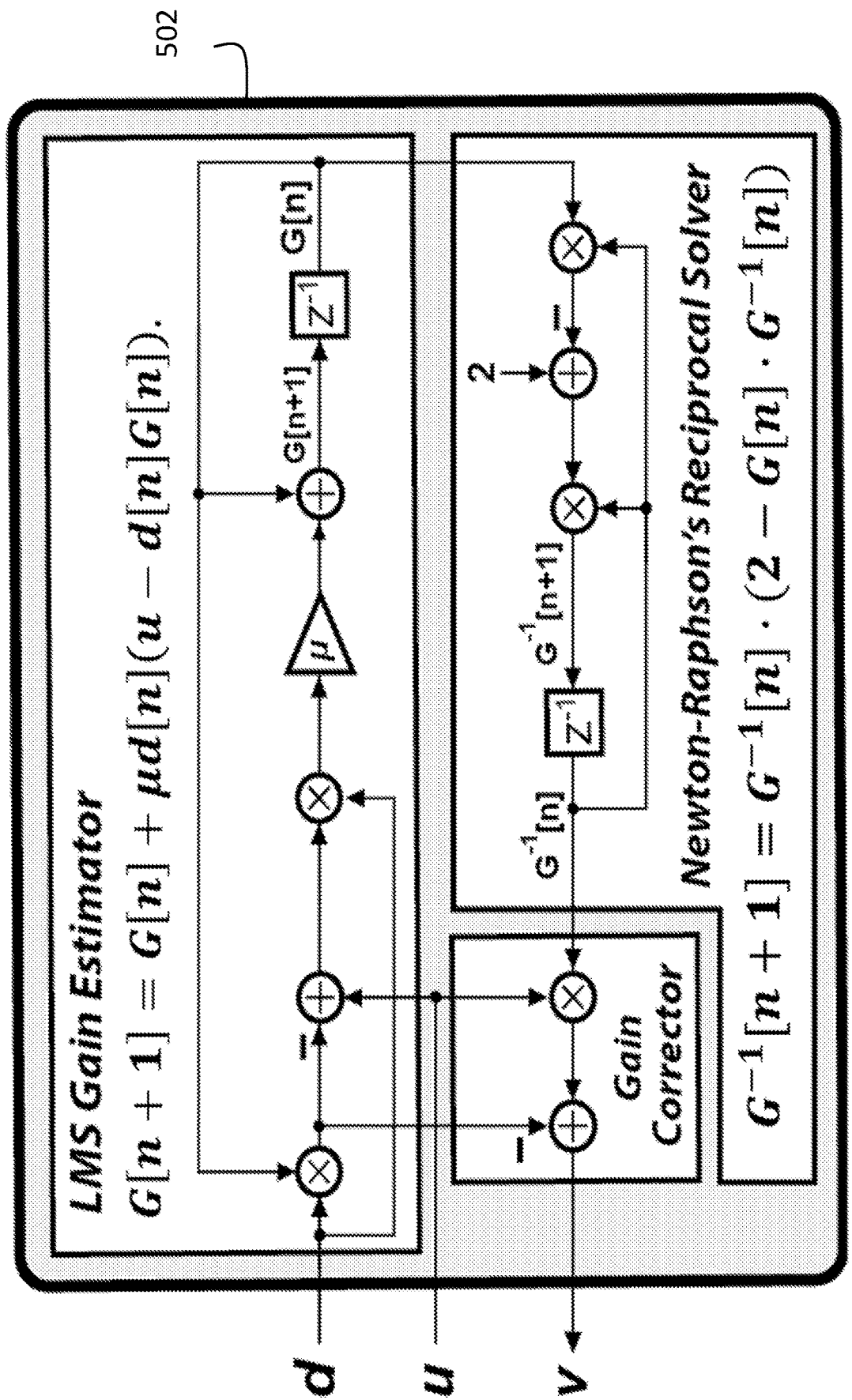
FIG. 5 is a block diagram of a preferred implementation for the GEC of FIG. 4.

To save hardware cost, a preferred estimator 502 is implemented recursively as shown in FIG. 5, with an LMS engine responsible for updating the loop gain value and a Newton-Raphson's Reciprocal solver to compute the inverse efficiently.

Figure 6:
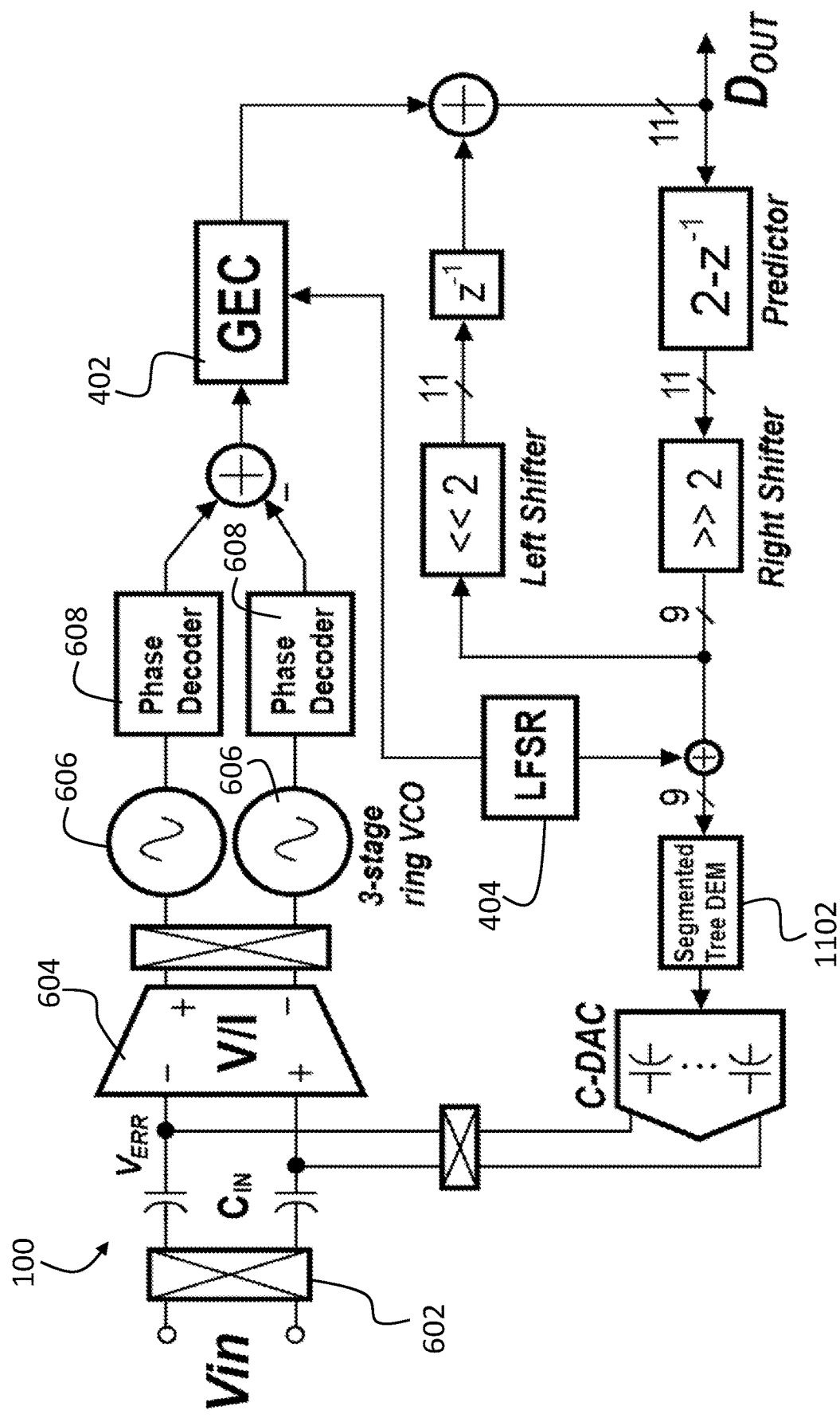
FIG. 6 is a schematic diagram of a preferred implementation of the FIG. 1 high-resolution VCO-based ADC.

FIG. 6 provides a detailed schematic of a preferred implementation of the high-resolution VCO based ADC 100, which consists of a three-stage VCO. The stage in "three stage VCO" means there are three inverters in the VCO. The inverters are configured such that the previous inverter's output driving the next inverter's input, and the third inverter's output drives the first inverter's input so they form a ring. Such a topology is called a ring VCO. Each inverter is called a stage. Since there are three inverters. It's called a three-stage ring VCO. The input signal is first chopped by a set of chopper switches 602 and capacitively-coupled to a V/I converter 604 which drives two ring VCOs 606 that are decoded by respective phase decoders 608 whose outputs are added differentially to reduce noise introduced by prior elements from the desired signal.

Figure 7:
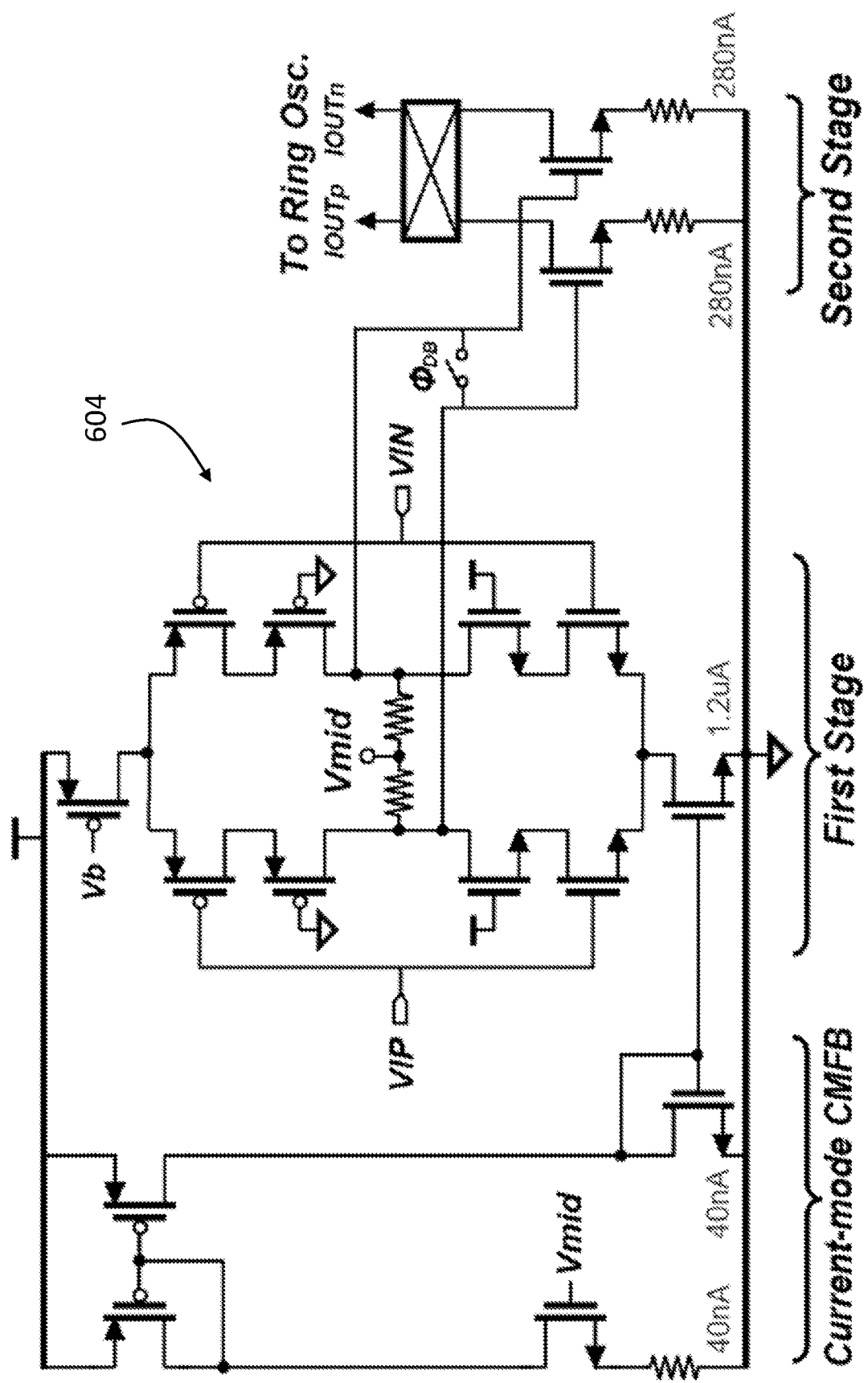
FIG. 7 is preferred V/I converter topology for the V/I converter in FIG. 6.

The V/I converter 604 is preferably implemented as a two-stage topology shown in FIG. 7. The first stage adopts a current-reuse structure to ensure low noise. Cascode transistors are preferably used to reduce the input capacitance due to Miller effect of $C_{gd}$ of the input pairs, thereby reducing signal attenuation. The second stage is optimized for linearity. It is designed as a source degenerated common source stage whose bias current level is defined by a current-mode CMFB. Thanks to the DPCM topology, the input voltage ($V_{ERR}$) swing to V/I converter remains very small therefore relaxing the linearity requirement of the V/I converter.

Figure 8:
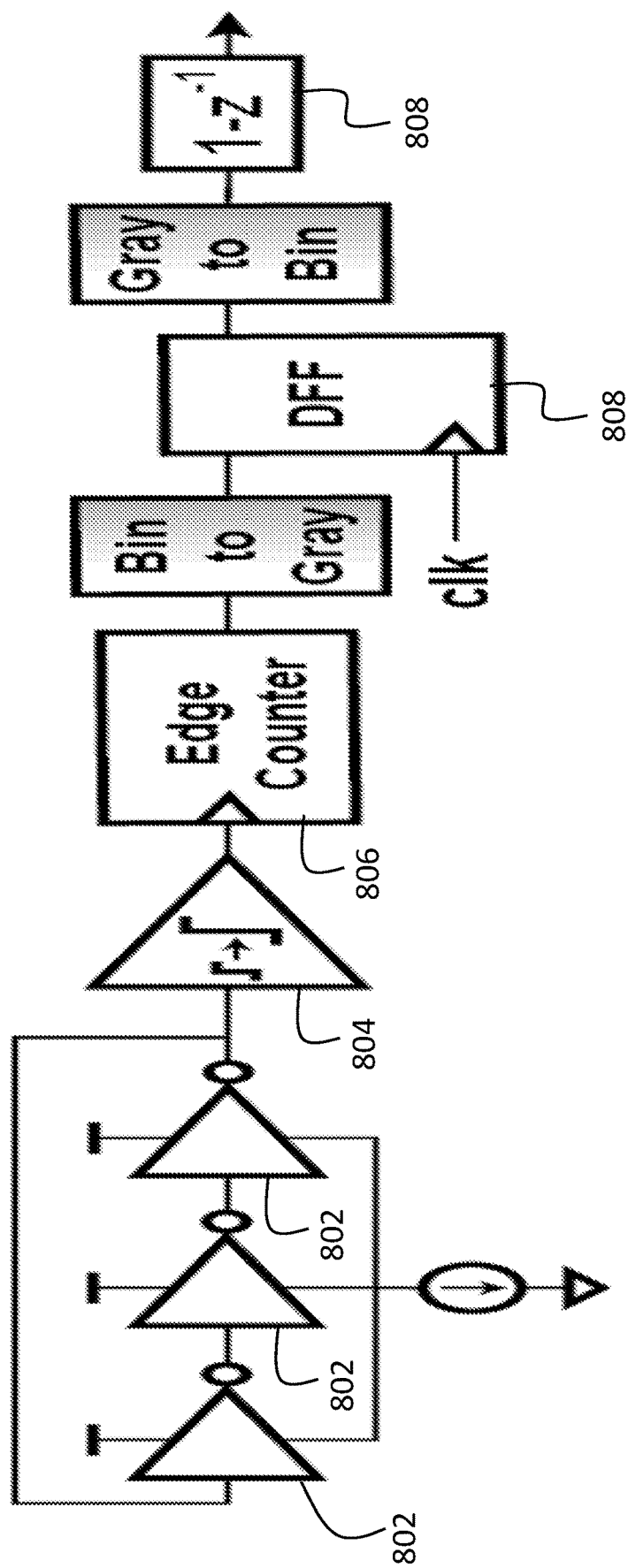
FIG. 8 is a schematic diagram of a preferred VCO quantizer shown in FIG. 6.

FIG. 8 is a schematic diagram of a preferred VCO quantizer 606. The preferred VCO 606 is implemented as a three-stage current-starved ring oscillator. The output of one of three stages 802 is tapped and level shifted by a level shifter 804 to full swing. This output then clocks a counter 806 whose output is sampled 808 by the main sampling clock. The sampled output then undergoes a differencing operation $(1-z^{-1})$ 810, finishing the quantization process. A binary-to-gray encoder 812 and a gray-to-binary decoder 814 are inserted before and after the sampler 808, respectively. The purpose of gray-encoding is to smooth crossing of clock domains between counter output (which is in the VCO clock) and the main sampling clock. Gray code ensures that there is always only one bit-flip between adjacent counter outputs, so that in the event of an ambiguous sampling instance, no intermediate erroneous outputs will be sampled.

Figure 9:
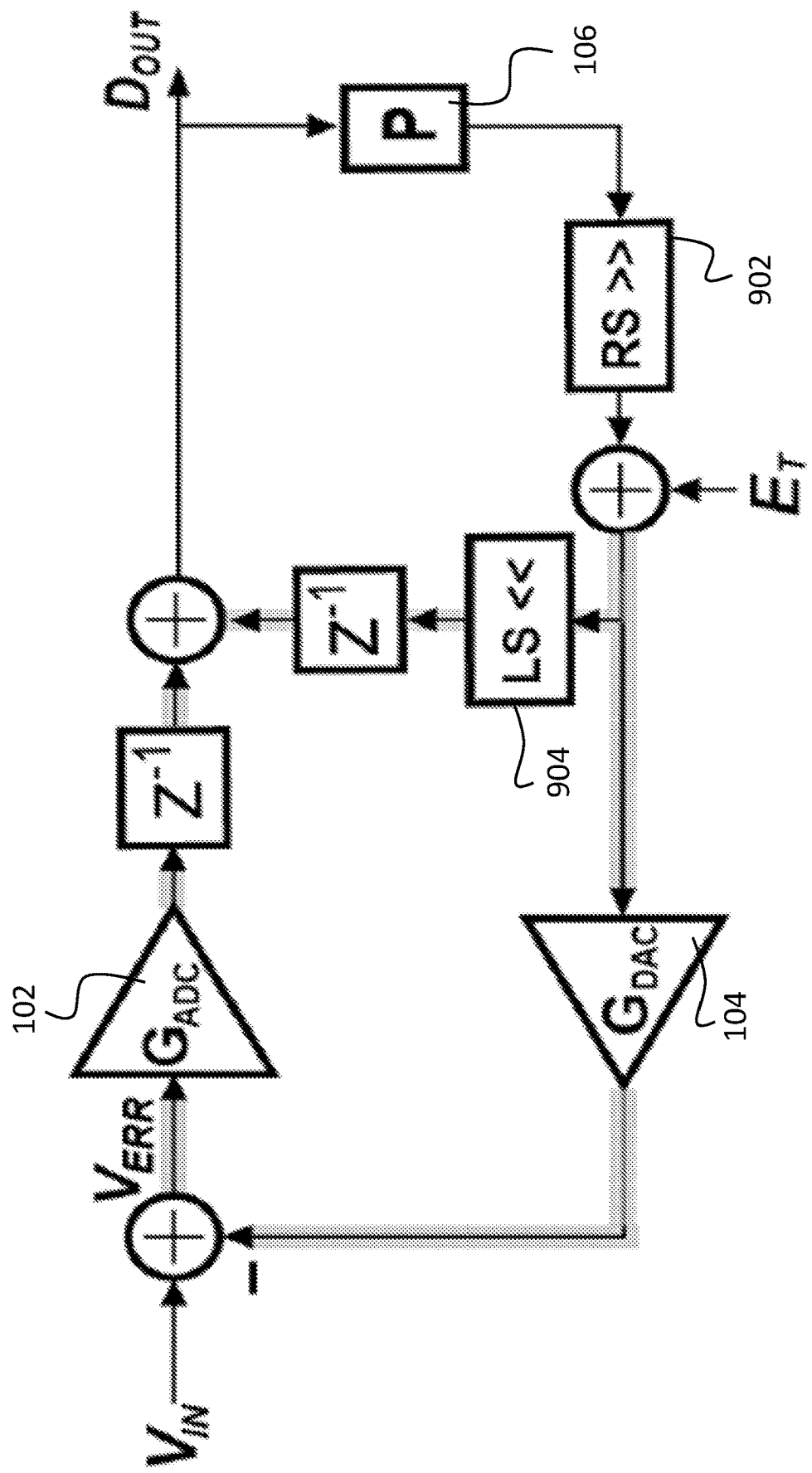
FIG. 9 shows a shifting scheme that eases design requirements for the preferred VCO-based ADC.

FIG. 9 shows a shifting scheme that eases design requirements for the VCO-based ADC 100. Specifically, to avoid designing a highly linear C-DAC, a right-shift 902 followed by a left-shift 904 are inserted in L2 to reduce the input bit-width to the DAC 100. The resulting truncation error $E_T$ does not affect the output because it travels through loop L1 and L2 (FIG. 2) with equal magnitude but opposite signs so it cancels. The maximal shifting amount is dictated by the maximal $V_{ERR}$ allowed at the V/I input without causing distortion.

Figure 10:
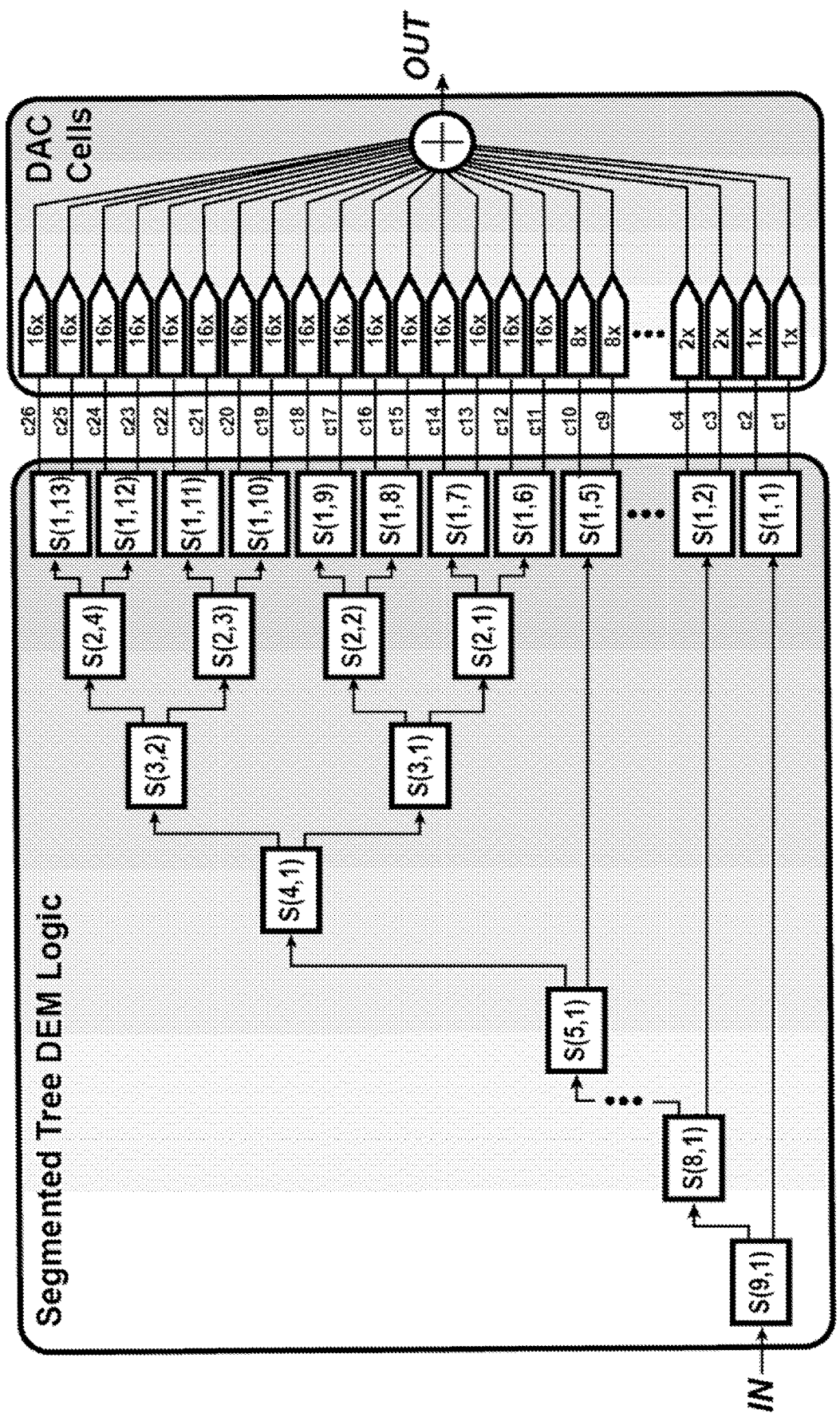
FIG. 10 is a block diagram of a preferred DEM logic for the DAC in the preferred VCO-based ADC.

The linearity of the DAC 100 is further enhanced by employing a hybrid DEM scheme (FIG. 10) which combines the traditional DWA DEM and the segmented tree DEM. The segmented tree DEM [K. L. Chan, N. Rakuljic and I. Galton, "Segmented Dynamic Element Matching for High-Resolution Digital-to-Analog Conversion," in IEEE Transactions on Circuits and Systems I: Regular Papers, vol. 55, no. 11, pp. 3383-3392, December 2008, doi: 10.1109/TCSI.2008.2001757]. In this example, it is a 9-bit input with 26-bit output to control segmented DAC elements. The segmented tree structure has two types of switching block (SB) called segmented SB and non-segmented SB. In FIG. 10, segmented SBs are from S(5,1) to S(9,1). The rest are non-segmented SBs. Compared to DWA, segmented tree DEM greatly reduces the number of output wires from 512 to 26. Also, the spectrum of segmented tree DEM does not have spurious tones. However, this is at the price of a higher noise level compared to DWA.

Figure 11:
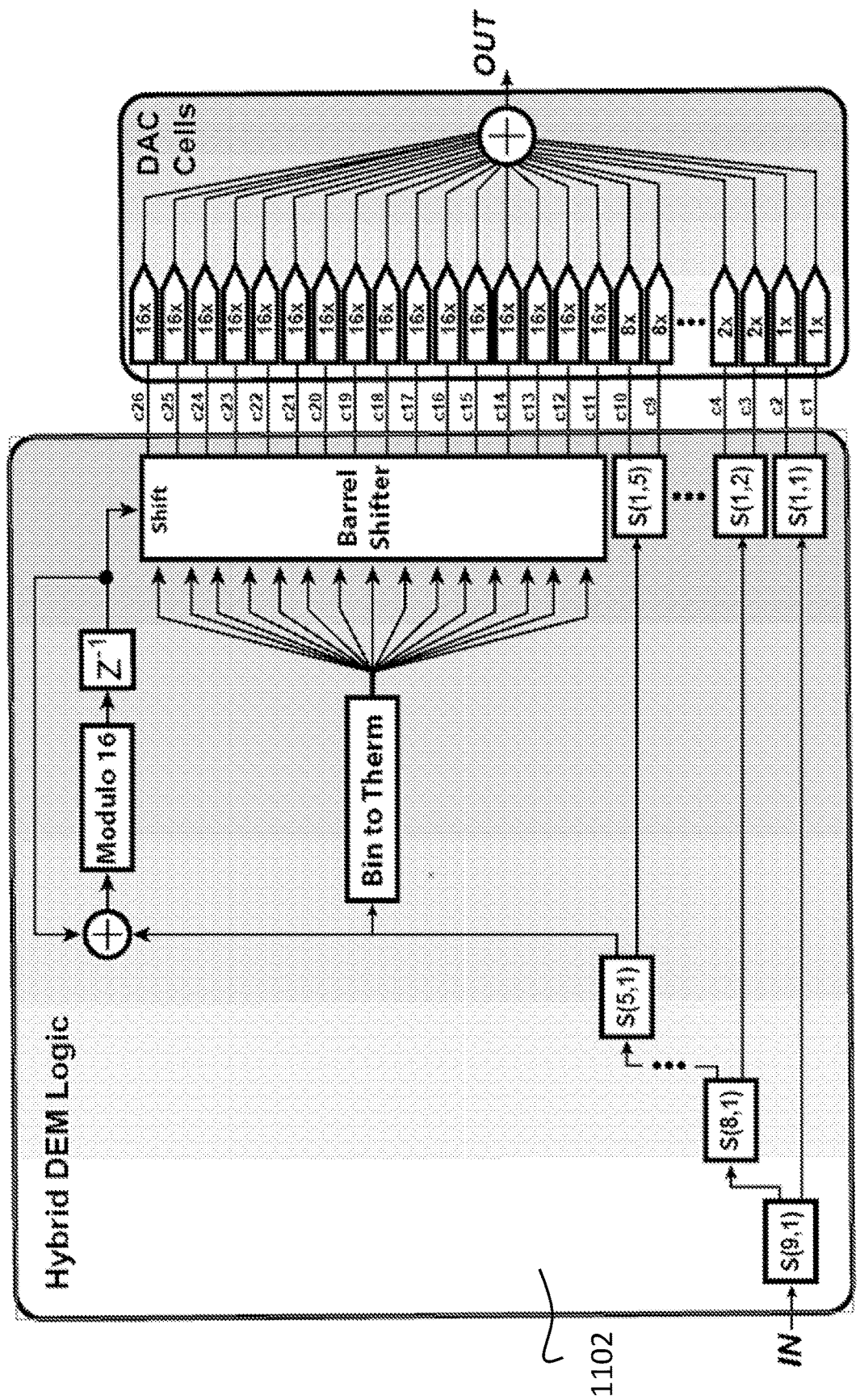
FIG. 11 is a logic diagram of a preferred hybrid DEM that is a modified version of the FIG. 10 DEM.

FIG. 11 is a logic diagram of a preferred hybrid DEM 1102 that is a modified version of the FIG. 10 DEM. The non-segmented SBs are the same as in FIG. 10. But the non-segmented SBs S(4,1), S(3,x), S(2,y), S(1,z) where x=1, 2; y=1, 2, 3, 4; z=6-13 are replaced by the traditional DWA logic. This hybrid DEM maintains the same benefit of reducing output wires as the segmented tree DEM. In addition, hybrid DEM reduces the noise floor by 3-5 dB without adding spurs. This is the result of combining the advantage of both DWA and segmented tree DEM.

Figure 12:
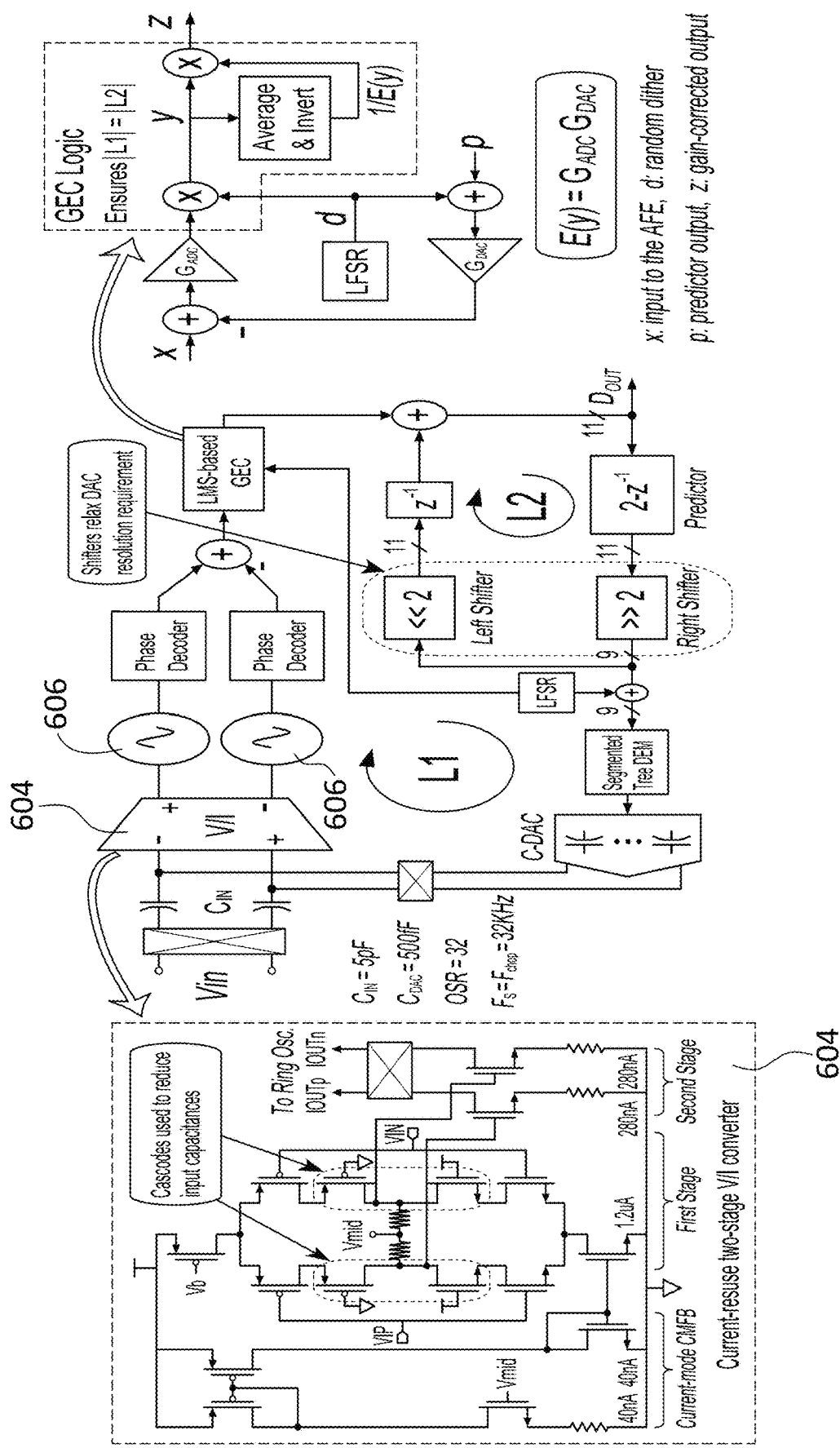
FIG. 12 is a combined diagram of a preferred high-resolution VCO-based ADC according to FIGS. 1-9 and 11.

FIG. 12 is a combined diagram of a preferred high-resolution VCO-based ADC according to FIGS. 1-9 and 11. The input signal $V_{in}$ is first chopped and capacitively-coupled to the V/I converter which drives two ring VCOs 606. The V/I 604 is a two-stage current-reused topology with a current-mode CMFB to ensure both good noise and well-defined output bias current level. Thanks to the DPCM topology, the input voltage (VERR) to the V/I 606 does not exceed 4 mVpp. A counter-based phase decoder decodes the VCO output $D_{out}$ to obtain the 11-bit digital code corresponding to 108 dB of SQNR. To avoid designing a highly linear 11-bit C-DAC, a right-shift-by-two followed by a left-shift-by-two are inserted in L2 to reduce it to 9-bit. The resulting truncation error does not affect the output because it travels through loop L1 and L2 with equal magnitude but opposite signs so it cancels. The maximal shifting amount is dictated by the maximal VERR allowed at the V/I input without causing distortion. Moreover, a segmented tree-structure DEM is employed to further maintain the C-DAC's linearity. In practice, the loop gain of L1 and L2 will not be the same due to PVT variations. This is solved by the all-digital gain error correction (GEC) logic to correct for the loop gain in the background. To make |L1|=|L2|, we need to ensure $G_{ADC}GD_{AC}=1$. As shown in FIG. 12, GEC uses a correlation-based calibration approach where a two-level (±1) zero mean random dither d from the LFSR is summed with the predictor output p and is multiplied with the quantizer output to obtain y whose average value can be shown to be $G_{ADC}G_{DAC}$. Once $G_{ADC}G_{DAC}$ is estimated, the loop gain can be corrected by normalizing its value with the estimate. The above procedure can be implemented as an on-chip LMS engine where the loop gain value is recursively updated to save hardware cost.

Figure 13:
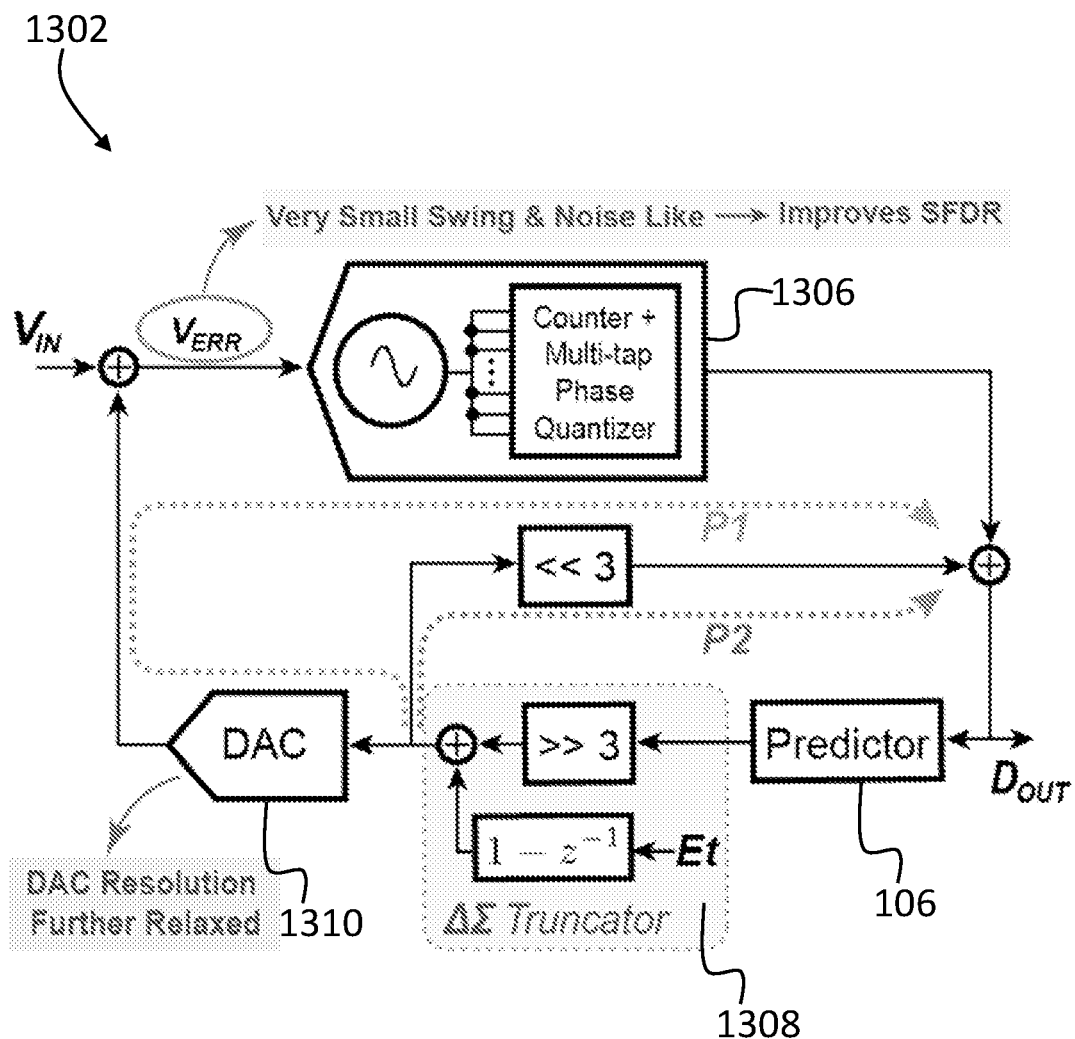
FIG. 13 illustrates a preferred calibration-free DPCM ADC that offers improved performance compared to the FIG. 6 implementation that uses truncation via simple level shifting and gain error correction.

FIG. 13 illustrates a preferred calibration-free DPCM ADC 1302 that offers improved performance compared to the FIG. 6 implementation that used truncation via simple level shifting and the GEC 402. The ADC 1302 reduces some power overhead attributable to the GEC 402 and enhances the truncation to allow further relaxation of the DAC resolution. Instead of the GEC 402 and the simple level shifting truncation, the ADC 1302 includes a VCO 1306 with multi-tap phase decoding and level shifting with ΔΣM truncation 1308 before a DAC 1310.

Figure 14A:
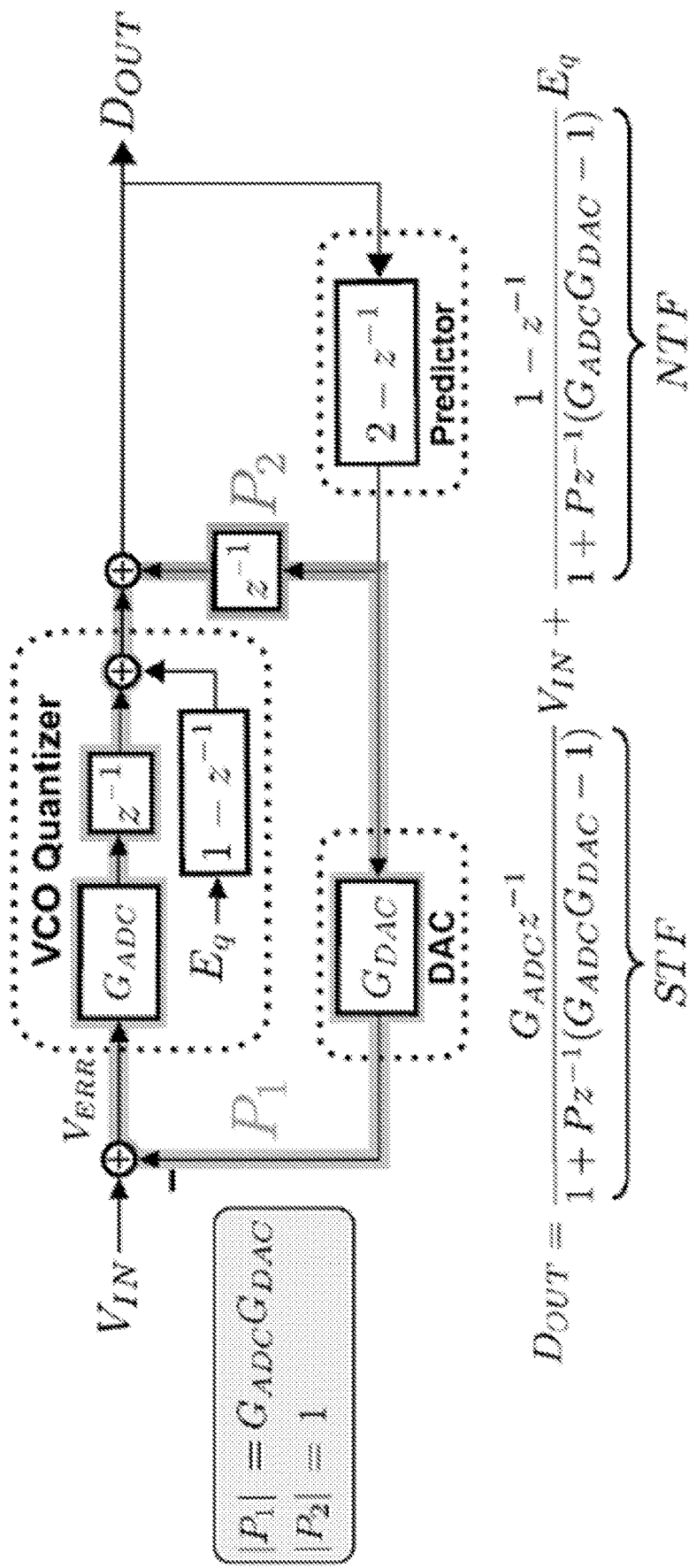
FIG. 14A is a discrete time model of the FIG. 13 ADC.
Figure 14B:
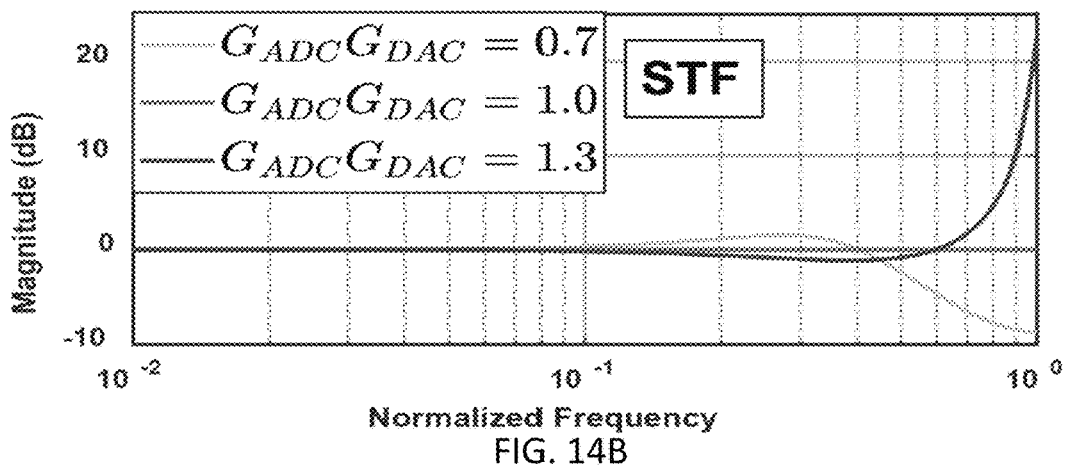
FIGS. 14B-14D respectively show the magnitude plots of the STF and NTF and the root locus plot of the pole location as $G_{ADC}G_{DAC}$ varies from 0.7 to 1.3 in FIG. 14A.
Figure 14C:
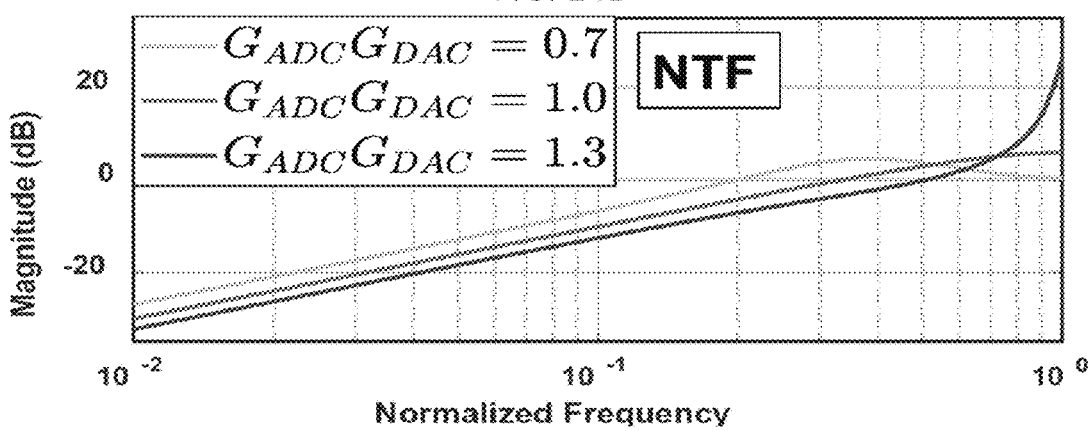
Figure 14D:
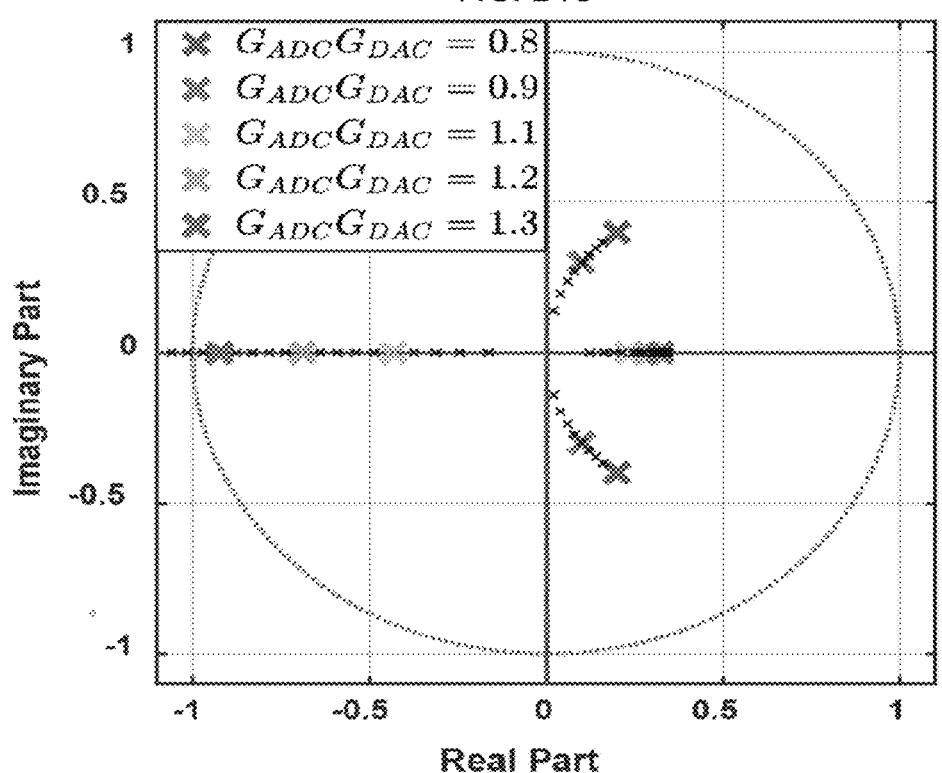
Figure 15:
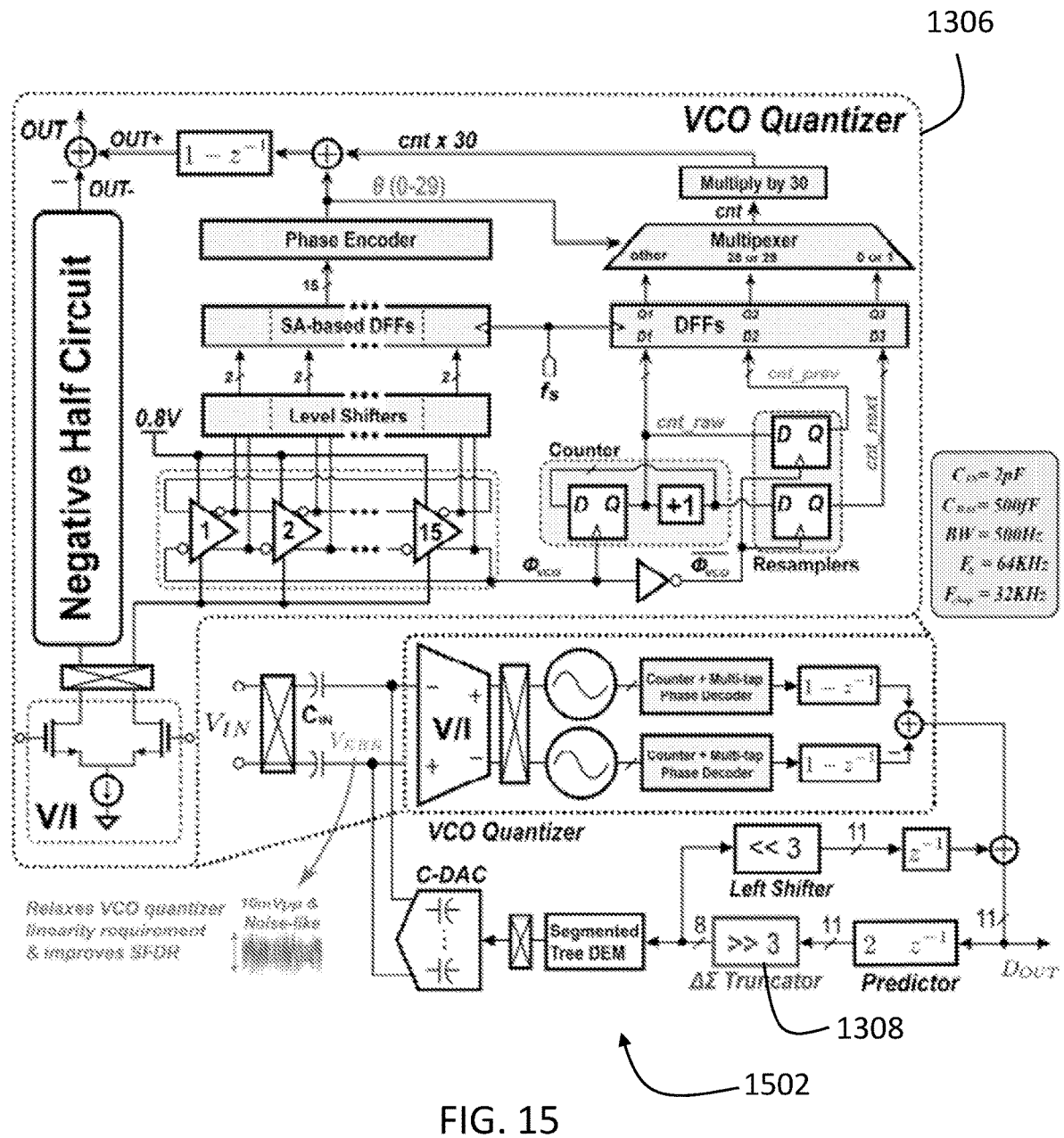
FIG. 15 is a circuit diagram illustrating a preferred VCO with multi-tap phase decoding for the DPCM ADC of FIG. 13 that was implemented in a 65 nm process.

FIG. 14A shows the discrete time model of the ADC 1302. When path gains are matched, $G_{ADC}G_{DAC}=1$, and $V_{IN}$ passes to $D_{OUT}$ via STF=$G_{ADC}$ $z^{-1}$, while the quantization noise is $1^{st}$ order shaped (NTF=$(1-z^{-1})$). To find out the impact on loop dynamics when $G_{ADC}G_{DAC}$ deviates from unity, FIGS. 14B-14D respectively show the magnitude plots of the STF and NTF and the root locus plot of the pole location as $G_{ADC}G_{DAC}$ varies from 0.7 to 1.3. Even under such large variation, both STF and NTF maintain their shape and only diverge at out-of-band frequencies. Also, loop stability can be ensured provided $G_{ADC}G_{DAC}$<1.34. Therefore, the nominal $G_{ADC}G_{DAC}$ is designed to be 0.9 to have extra margin for stability. MC simulation of 100 runs shows a 3σ range from 0.81 to 1.02, well within tolerance. These analyses form the mathematical basis of the calibration-free DPCM architecture FIG. 15 is a circuit diagram illustrating a preferred VCO 1502 with multi-tap phase decoding for the DPCM ADC 1302. The VCO 1502 includes the ΔΣ truncator 1308 instead of the right and left shift truncation approach discussed above with respect to FIG. 6.

The AFE, which primarily consists of the VCO quantizer 1306 and a feedback C-DAC with segmented-tree DEM, structured according to the DPCM architecture. With OSR=64, successive input samples are highly correlated, and thus the VCO quantizer sees a $V_{ERR}$<10 $mV_{pp}$ swing thanks to DPCM, which only exerts the VCO's small signal linear regime. To reduce the DAC's resolution requirement, truncation is performed right before the DAC to directly reduce its resolution. The ΔΣM truncation 1308 high-pass shapes ET, which provides 3 dB in-band SNR improvement by eliminating residual ET due to incomplete cancellation compared to the FIG. 6 implementation. It also allows a more aggressive truncation, significantly relaxing the DAC resolution requirement. Importantly, the shaped ET makes the VCO quantizer input noise-like, and is thus less correlated to VN. Therefore, any remaining non-linearity of the VCO quantizer acting on Vax does not generate tones, thereby dramatically improving SFDR. As seen in FIG. 15, the VCO quantizer 1306 includes a V/I converter, 15-stage rings, and multi-tap phase decoders. Thanks to relaxed linearity requirements, the rings are directly stacked on top of the V/I implemented simply as a differential pair, improving power efficiency by 2.5× via direct current re-use. To allow a fine quantization and lift restrictions on $f_{VCO}$ range, phase quantization is achieved via a counter+multi-tap phase decoding scheme, where the fine quantized phase, θ, with 30 levels in 2π is combined with a counter clocked by one stage output, ΦVCO, to keep track of phase wrap-around. To avoid metastability due to crossing clock domains, the inverted version, $\overline{\Phi VCO}$, is used to resample the counter output and the next count so that the correct and metastability-free cnt is selected based on θ.

The ADC 1502 of FIG. 15 was fabricated in 65 nm, the AFE occupies 0.055 mm² and draws 1.68 µW from a single 0.8V supply. The measured output spectrum with a full-scale input (460 mVpp), demonstrated 94.2 dB-SNDR, 95.1 dB-DR, and 2.64 µVrms IRN in 500 Hz of BW. Importantly, even with a 4M-point FFT averaged 8×, there were no visible harmonic tones, yielding a noise-floor limited SFDR of 128 dB. Thanks to the GEC ensuring |L1|=|L2|, the noise floor is reduced due to complete cancellation of truncation error. The measured SNDR/SFDR/DR are 87/105.1/90 dB, which shows a high linearity enabled by the DPCM structure. A noise PSD level of 85 nV/rtHz was achieved, yielding an integrated IRN of 1.9 µVRMS in 500 Hz of bandwidth. Experiments showed that the SNDR steadily increases to the peak value as the loop gain L1 is estimated and corrected, validating the GEC's operation. The experimental fabrication demonstrated the best overall tradeoff among power, noise, linearity, and input impedance for ADC-direct AFEs known to the inventors from prior published works.

Figure 16:
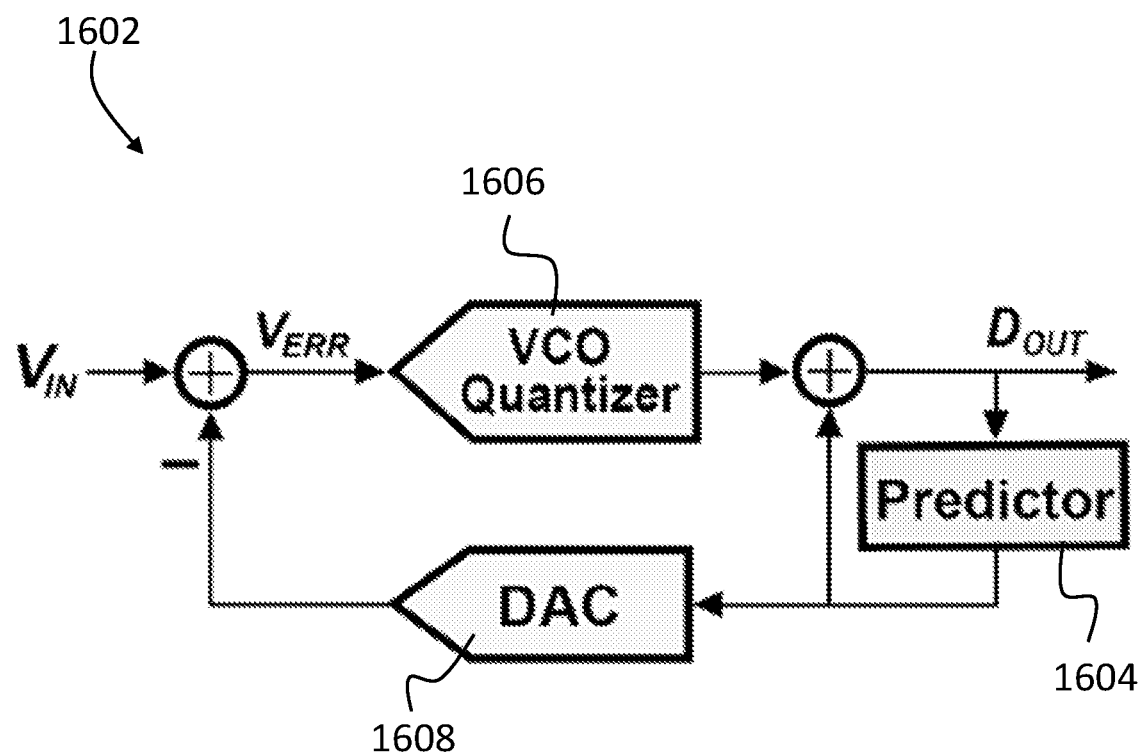
FIG. 16 is a block diagram of a preferred ADC with DCPM for audio applications.

FIG. 16 shows a preferred DCPM approach 1602 for audio applications. As with the above embodiments, a predictor 1604 permits a VCO quantizer 1606 sees a small swing, thereby reducing the V-F distortion since now the VCO 1606 operates in the small-signal linear region. As discussed above, present approaches can avoid the need for designing a highly linear DAC 1608 in the feedback loop.

Figure 17:
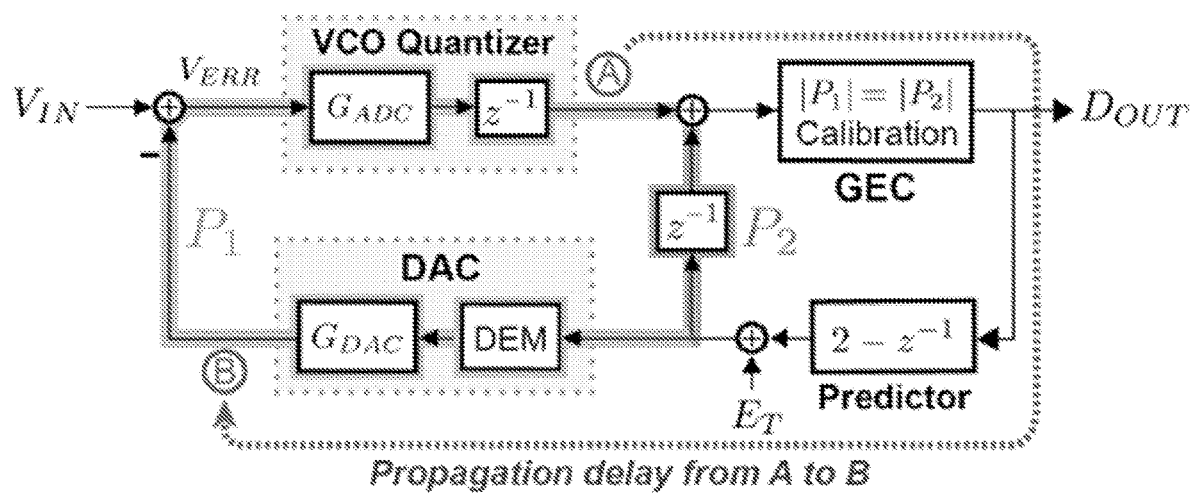
FIG. 17 illustrates the swing reduction that the VCO sees with a discrete-time model.

FIG. 17 illustrates the swing reduction that the VCO 1606 sees with a discrete-time model, where the VCO quantizer 1606 and DAC 1608 are replaced by gain blocks and delays. It is worth noting that there are two paths, $P_1$ and $P_2$, where the gain of $P_1$ is highly sensitive to PVT due to the VCO 1606. A correlation-based gain error calibration (GEC) logic can be used to ensure equal path gain magnitudes (i.e., $|P_1|=|P_2|$). Since $|P_2|=1$, the goal of GEC is to ensure:

$$|P_1|=1$$

Given this, it can be demonstrated that the transfer function from $V_{IN}$ to $D_{OUT}$ is:

$$\frac{D_{OUT}}{V_{IN}} = G_{ADC}z^{-1}$$

When the predictor's response is chosen to be $2-z^{-1}$, the transfer function from $V_{IN}$ to $V_{ERR}$ is:

$$\frac{V_{ERR}}{V_{IN}} = (1-z^{-1})^2$$

which is a $2_{nd}$-order highpass, thereby providing significant swing reduction at the VCO input (at low frequency, given a certain oversampling ratio (OSR)). For example, with 32×OSR, the swing reduction is at least 40 dB in the signal band. The DAC requirements can be reduced with the simple GEC truncation or ΔΣ truncator discussed above. However, audio applications are especially sensitive to propagation delays and the GEC approach above provide a generally negligible delay, e.g., only 0.5% of one clock period given a 32 kHz clock speed and is taken care of by simply zeroing out the forward path during the 150 ns window. It is, nonetheless, a serious issue when porting to the audio band. Assuming a reasonable clock speed of 2 MHz for the audio ADC, the 150 ns delay represents 30% of the 500 ns clock period. If we again zero out the forward path for 150 ns, we would attenuate the signal by 3.1 dB. The ΔΣ truncator noise shaping approach requires tracking for consistent performance in audio applications.

Figure 18:
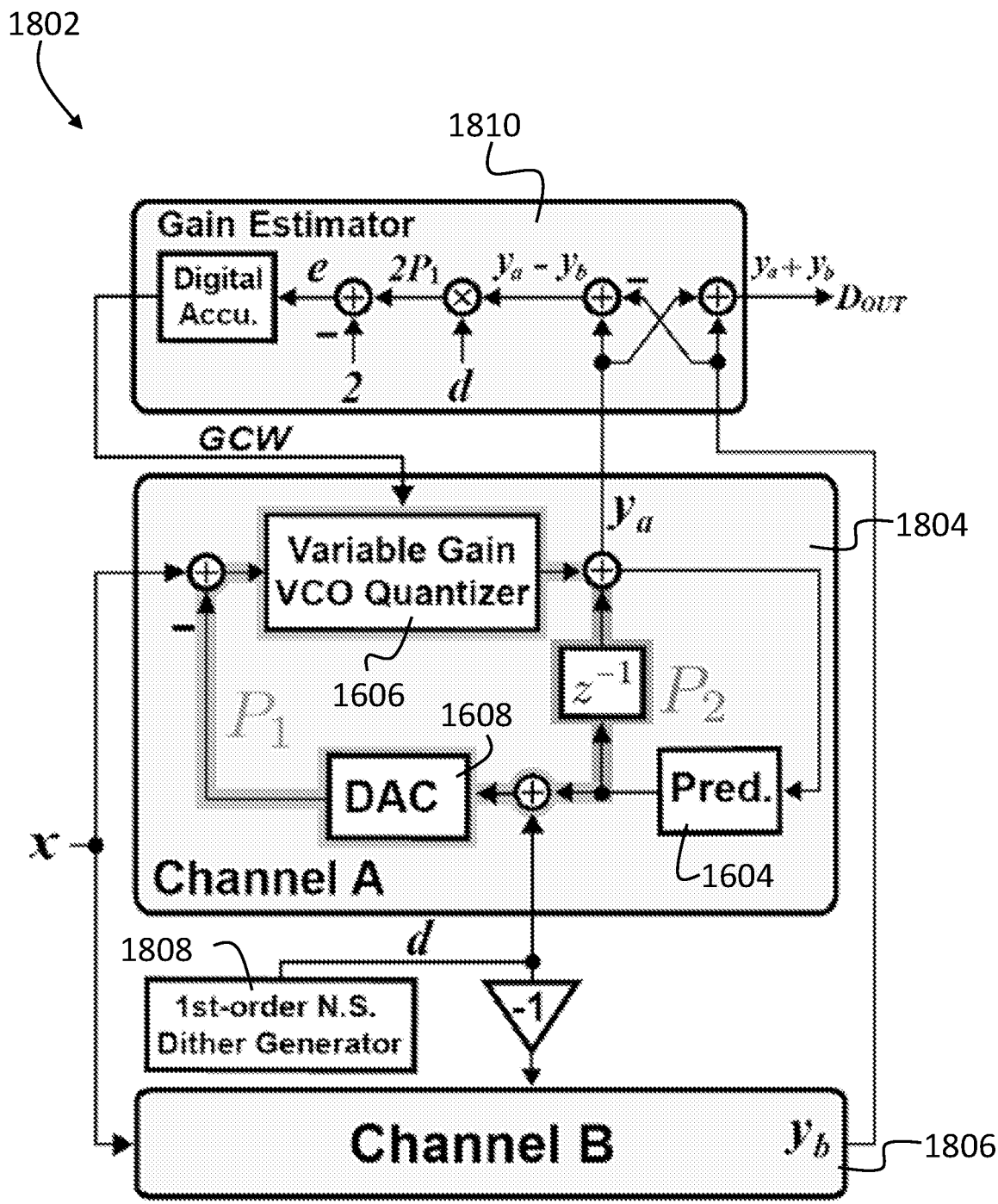
FIG. 18 shows a preferred split-ADC architecture for sensitive applications including audio data applications.

These issues are avoided with a preferred split-ADC architecture 1802 in FIG. 18 where an ADC is split into two identical sub-ADCs 1804 and 1806 converting the same input signal, x. A dither generator 1808 produces a two-level 1st-order highpass-shaped sequence, d, with zero mean. d is then injected to both channels with opposite polarity via the DAC 1608. The resulting channel A and B output, $y_A$ and $y_B$, can be approximated by:

$$y_A = G_A \cdot x + P_{A1} \cdot d,$$

$$y_B = G_B \cdot x - P_{B1} \cdot d,$$

where $G_A$ is the sub-ADC gain of channel A and $P_{A1}$ is the $P_1$ path gain of channel A, similarly for channel B. The overall ADC output, $D_{OUT}$, is obtained by summing $y_A$ and $y_B$:

$$D_{OUT}=(G_A+G_B)\cdot x+(P_{A1}+P_{B1})\cdot d,$$

where d is largely cancelled. Thanks to d being high-pass shaped, any residual d due to mismatch has minimal impact on in-band SNR.

$P_1$ gain estimation 1810 is performed by taking the difference between $y_A$ and $y_B$. Assuming matched channels, the difference is simply $2P_1 \cdot d$. Noting that $d_2=1$, $2P_1$ can be extracted by multiplying with d. Since d takes only values of ±1, this multiplication is simply sign flipping. The P1 gain error, e, is obtained by subtracting 2. Finally, a digital accumulator integrates e and generates a gain control word (GCW) to adjust $K_{VCO}$ of the variable gain VCO quantizer 1606.

In practice, mismatch exists between the two channels. In this case, it can be shown that e is given by:

$$e=\Delta G\cdot x\cdot d+(P_{A1}+P_{B1}-2)$$

where $\Delta G=G_A-G_B$. Two issues exist due to mismatch. First, there are residual converted samples, $\Delta G_x$, due to incomplete subtraction. Fortunately, Monte Carlo simulation shows a 3σ channel gain mismatch of 2.3%. Therefore, $\Delta G_x$ is very small in amplitude and is readily de-correlated out. Second, the estimator is indifferent to the $P_1$ gain of individual channel and only sees the averaged $P_1$ of the two channels, as can be seen in the second term. This causes the estimator to converge to the mean of the two channels' $P_1$. This, however, is also a minor issue thanks to the small mismatch between channels.

With this GEC approach, the calibration is taken out of the sub-ADCs, adding no delay to the inner loops while desirably maintaining operation in the background. In addition, the split-ADC architecture enables great reduction of convergence time by significantly reducing the magnitude of the unknown ADC input signal during the calibration process. Finally, gain adjustment is performed inside the VCO, avoiding the need for hardware-expensive multiplication and division, thereby saving area and power.

Figure 19:
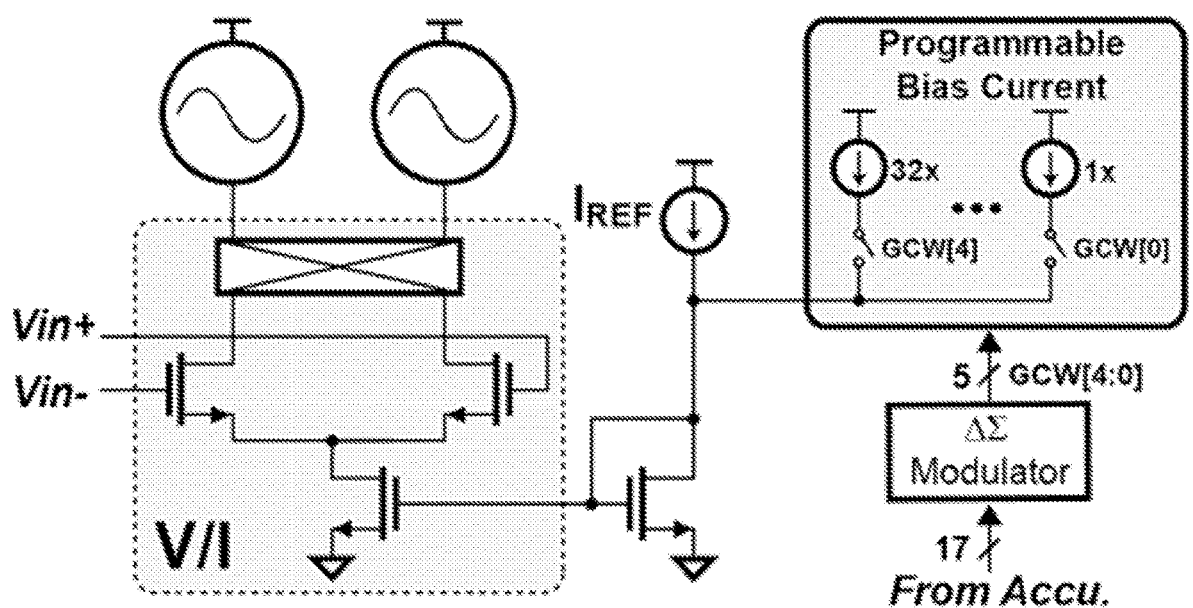
FIG. 19 shows a preferred bias current through the V/I converter.

The FIGS. 16-18 audio ADC was implemented with the DEM 1102 of FIG. 11. The ADC has a signal bandwidth of 20 kHz. The sampling frequency, fs, is 2 MHz, corresponding to an OSR of 50. The FIGS. 16-18 approach significantly reduces the loop delay to 30 ns, accounting for only 6% of one sampling period. The VCO quantizer 1606 allows adjustable KVCO as programmed by GCW. The KVCO is proportional to the Gm of the V/I converter. Thus, as shown in FIG. 19, KVCO is adjusted by tuning the bias current through the V/I converter, which in turn changes the Gm. The KVCO tuning range is ±40% to cover a wide range of operating conditions. 5-bit tuning resolution is implemented, corresponding to a 2.5% step size, which is found to provide a good tradeoff between hardware cost and calibration artifacts. To generate the 5-bit GCW, a digital $\Delta\Sigma M$ is used to modulate the 17-bit accumulator output from the gain estimator.

The ADC was fabricated in a 65-nm LP process. An audio generator (APx555b) buffered by an OPA1632 fully differential driver was used to drive the ADC. At peak SNDR and the SN(D) versus input amplitude, 94.2-dB SNDR and 100.3-dB DR was demonstrated. Oout-of-band spurs are due to the shaped DAC mismatches by the DWA used in the hybrid DEM. Since they are out of band, there is little impact on SNDR. The PSRR measured with a 60 Hz supply ripple is 83 dB. The CMRR measured at 60 Hz with full-scale input is 76 dB. Thanks to the DPCM structure, this work exhibits significantly better linearity, thereby achieving over 20-dB better SNDR-based FoM amongst VCO-based ADCs. When compared to voltage-domain $\Delta\Sigma Ms$, this work also achieves competitive performance while offering process scalability and potentially lower supply operation not easily achieved in voltage-domain converters While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. An analog to digital conversion (ADC) circuit comprising:
    a voltage-controlled oscillator (VCO)-based quantizer that receives a voltage input signal to be quantized and provides a digital output;
    a predictor that samples the digital output, evaluates correlation between successive samples, and predicts a predicted quantization error correction from the correlation to minimize voltage-to-frequency transfer of the VCO;
    a feedback loop L1 with a digital to analog converter (DAC) receiving the predicted quantization error correction, converting it and adding it to the voltage input signal; and
    a feedback loop L2 to add the predicted quantization error to the digital output.

2. The ADC circuit of claim 1, wherein a z-transform function of the predictor is $2-z^{-1}$.

3. The ADC of claim 1, comprising gain error correction logic (GEC) in feedback loop L2 to equalize gain between the feedback loops L1 and L2.

4. The ADC of claim 3, comprising injection of a two-level (±1) zero mean random dither d into the DAC and the GEC.

5. The ADC of claim 4, wherein the GEC logic multiplies the dither d with a GEC input u to obtain a product x, wherein the input u consists of:

$$u=G_{ADC}G_{DAC}d+C$$

where c comprises components uncorrelated with d.

6. The ADC of claim 5, wherein the GEC averages the product x to obtain average gain $\hat{G}$, which is the estimate of loop gain $G_{ADC}G_{DAC}$, and then corrects loop gain by normalizing its value with the estimate via first inverting the estimate and then multiplying input u with the inverse.

7. The ADC of claim 6, wherein the estimate is provided by least mean square (LMS) engine that updates the loop gain value and a Newton-Raphson's Reciprocal solver to compute the inverse.

8. The ADC of claim 1, wherein the predicted quantization error correction is truncated by truncation logic before input to the DAC.

9. The ADC of claim 8, wherein the truncation logic comprises a right-shift followed by a left-shift in the feedback loop L2 to reduce input bit-width to the DAC.

10. The ADC of claim 9, wherein each of the pair of VCOs are implemented as two stages with a first stage having a current-reuse structure and a second stage that is a source degenerated common source.

11. The ADC of claim 8, wherein the truncation logic comprises a noise shaping ΔΣ truncator.

12. The ADC of claim 11, wherein the noise shaping ΔΣ truncator high-pass shapes truncation error.

13. The ADC of claim 1, wherein the VCO-based quantizer comprises a pair of VCOs arranged differentially.

14. The ADC of claim 1, wherein the VCO-based quantizer comprises a three-stage current-starved ring oscillator with an output of one of three stages being tapped and level shifted by a level shifter to full swing, wherein a left shifter output clocks an edge counter whose output is sampled by a main sampling clock, and the sampled output is differenced to finish quantization.

15. The ADC of claim 14, comprising gray-encoding to smooth crossing of clock domains between the edge counter output and the main sampling clock.

16. The ADC of claim 1, wherein the VCO-based quantizer comprises multi-tap phase decoding.

17. The ADC of claim 1, wherein the DAC comprises a segmented-tree dynamic matching element DAC.

18. The ADC of claim 1, comprising a split-ADC architecture with two identical sub-ADCs converting the same input signal, x, forming two channels A and B and a dither generator producing a two-level 1st-order highpass-shaped sequence, d, with zero mean that is injected into both of the two channels.

19. The ADC of claim 18, wherein the resulting channel A and B output, $y_A$ and $y_B$, can be approximated by:

$$y_A = G_A \cdot x + P_{A1} \cdot d,$$

$$y_B = G_B \cdot x - P_{B1} \cdot d,$$

where $G_A$ is the sub-ADC gain of channel A and $P_{A1}$ is the $P_1$ path gain of channel A, similarly for channel B, and the overall ADC output, $D_{OUT}$, is obtained by summing $y_A$ and $y_B$.

20. The ADC of claim 19, wherein $P_1$ gain estimation is performed by taking the difference between $y_A$ and $y_B$, which is $2P_1 \cdot d$, which multiplication is comprises sign flipping, a P1 gain error, e, is obtained by subtracting 2, a digital accumulator integrates e and generates a gain control word (GCW) to adjust variable gain of the VCO-based quantizer.

* * * * *